(12) United States Patent
Sasaki et al.

(10) Patent No.: US 6,727,782 B2
(45) Date of Patent: Apr. 27, 2004

(54) MULTILAYERED LC COMPOSITE COMPONENT AND METHOD FOR MANUFACTURING THE SAME

(75) Inventors: Tomohiro Sasaki, Fukui (JP); Takahiro Azuma, Fukui (JP); Shigekatsu Yamamoto, Takefu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/192,155

(22) Filed: Jul. 11, 2002

(65) Prior Publication Data

US 2003/0030510 A1 Feb. 13, 2003

(30) Foreign Application Priority Data

Aug. 9, 2001 (JP) .......................................... 2001-241608

(51) Int. Cl.[7] ................................................. H03H 7/01
(52) U.S. Cl. ........................ 333/185; 333/204; 333/202; 333/116
(58) Field of Search ................................ 333/185, 204, 333/202, 116, 246, 177, 181

(56) References Cited

U.S. PATENT DOCUMENTS

| | | | | |
|---|---|---|---|---|
| 3,980,975 A | * | 9/1976 | Maxon et al. | 333/185 |
| 5,668,511 A | * | 9/1997 | Furutani et al. | 333/185 |
| 6,191,666 B1 | * | 2/2001 | Sheen | 333/185 |
| 6,448,873 B1 | * | 9/2002 | Mostov | 333/185 |

* cited by examiner

Primary Examiner—Michael Tokar
Assistant Examiner—Lam T. Mai
(74) Attorney, Agent, or Firm—Keating & Bennett, LLP

(57) ABSTRACT

A multilayered LC composite component includes a main body having a pair of side surfaces, a pair of end surfaces, and an upper surface and a lower surface. Ground-side terminal electrodes are disposed at the center of the side surfaces and hot-side terminal electrodes are disposed along edges of the side surfaces. Each of the hot-side terminal electrodes includes an end surface extended portion extending to each of the end surfaces. The end-surface extended portion is arranged so that at least the approximate center of each of the end surfaces is exposed.

20 Claims, 10 Drawing Sheets

MULTILAYERED LC COMPOSITE COMPONENT AND METHOD FOR MANUFACTURING THE SAME

BACKGROUND OF THE INVENTION

1. Field of the Invention

The present invention relates to a multilayered LC composite component and a method for manufacturing the same. More particularly, the present invention relates to improvements in the arrangement of terminal electrodes disposed on the outer surface of the main body of a component.

2. Description of the Related Art

FIG. 13 is a perspective view showing a known multilayered LC composite component 1 related to the present invention. FIG. 14 is a sectional view showing the inner configuration of the multilayered LC composite component 1 shown in FIG. 13.

The multilayered LC composite component 1 includes a rectangular main body 2. The main body 2 includes a pair of side surfaces 3 and 4 facing each other, a pair of end surfaces 5 and 6 facing each other, and an upper surface 7 and a lower surface 8 facing each other.

The main body 2 has a multilayer configuration including a plurality of electrical insulating layers and has capacitor elements 10 and an inductor element 11. In the multilayered LC composite component 1 shown in FIG. 14, one inductor element (L) 11 is disposed between two capacitor elements (C) 10 so as to provide a C-L-C arrangement.

Each of the capacitor elements 10 includes capacitor electrodes 12 on the electrical insulating layers 9. The capacitor electrodes 12 face each other with the electrical insulating layers 9 therebetween so as to define a capacitance.

The inductor element 11 includes a coil conductor 13 on the electrical insulating layers 9. As shown in FIG. 14, the coil conductor 13 includes coil conductive films 14 extending along specific interfaces between the electrical insulating layers 9 and a coil via-hole conductor (not shown) penetrating specific electrical insulating layers 9, and the overall coil conductor 13 defines a helix.

At the center of each of the side surfaces 3 and 4 of the main body 2, ground-side terminal electrodes 16 and 17 are provided, respectively. Also, hot-side terminal electrodes 18 and 19 are disposed on the end surfaces 5 and 6, respectively.

Each of the capacitor electrodes 12 includes ground-side extended portions (not shown) extending to the side surfaces 3 and 4. The ground-side terminal electrodes 16 and 17 are connected to the ground-side extended portions, and accordingly, the inductor element 11 is connected to the ground-side terminal electrodes 16 and 17 via each of the capacitor elements 10 and 11.

Each of the capacitor electrodes 12 includes hot-side extended portions 20 and 21 extending to the end surfaces 5 and 6 of the main body 2. On the other hand, the coil conductor 13 includes coil extended portions 22 and 23 extending to the end surfaces 5 and 6, respectively.

The hot-side terminal electrodes 18 and 19 are connected to the coil extended portions 22 and 23, respectively, so as to be connected to each end of the inductor element 11. Also, hot-side extended portions 20 and 21 are connected to the hot-side terminal electrodes 18 and 19, respectively.

In this way, the multilayered LC composite component 1 shown in FIGS. 13 and 14 constitutes a π-type LC filer.

The terminal electrodes 16 to 19 are usually formed by applying and baking a conductive paste. However, a process of applying a conductive paste must be performed four times in order to form the terminal electrodes 16 to 19. That is, a first process of applying a conductive paste on one side surface 3 to form the ground-side terminal electrode 16, a second process of applying a conductive paste on the other side surface 4 to form the ground-side terminal electrode 17, a third process of applying a conductive paste on one end surface 5 to form the hot-side terminal electrode 18, and a fourth process of applying a conductive paste on the other end surface 6 to form the hot-side terminal electrode 19 are needed.

In this method, the number of processes of applying a conductive paste increases, and as a result, the cost for manufacturing the multilayered LC composite component 1 increases.

Further, stray capacitance generated between the coil conductor 13 and the terminal electrodes 16 to 19, stray capacitance generated between the capacitor electrodes 12 and the terminal electrodes 16 to 19, and stray capacitance generated between the ground-side terminal electrodes 16 and 17 and the hot-side terminal electrodes 18 and 19 become relatively large. Accordingly, the self-resonance frequency becomes relatively low, which deteriorates the high-frequency characteristics.

SUMMARY OF THE INVENTION

In order to overcome the problems described above, preferred embodiments of the present invention provide a multilayered LC composite component and a method for manufacturing the same, having an improved arrangement of terminal electrodes disposed on the outer surface of the main body of a component and in which the number of steps required to form the terminal electrodes is reduced and the stray capacitance problems of the prior art are eliminated.

According to a first preferred embodiment of the present invention, a multilayered LC composite component includes a substantially rectangular main body having a pair of side surfaces facing each other, a pair of end surfaces facing each other, and an upper surface and a lower surface facing each other. The main body has a laminated construction including a plurality of electrical insulating layers and has a capacitor element and an inductor element. The capacitor element includes capacitor electrodes on the electrical insulating layers and the inductor element includes a coil conductor on the electrical insulating layers. Each of the capacitor electrodes includes ground-side extended portions extending to the pair of side surfaces and the coil conductor includes coil extended portions extending to the pair of side surfaces. Each of the side surfaces is provided with a ground-side terminal electrode connected to each of the ground-side extended portions and a plurality of hot-side terminal electrodes connected to the coil extended portions are disposed on both ends of the pair of side surfaces so as to be connected to the end of the inductor element. The pair of end surfaces are provided with end-surface extended portions of the plurality of hot-side terminal electrodes so that at least the approximate center of each of the pair of end surfaces is exposed.

According to a second preferred embodiment of the present invention, a multilayered LC composite component includes a substantially rectangular main body having a pair of side surfaces facing each other, a pair of end surfaces facing each other, and an upper surface and a lower surface facing each other. The main body has a laminated construction including a plurality of electrical insulating layers and has a capacitor element and an inductor element. The capacitor element includes capacitor electrodes on the electrical insulating layers and the inductor element includes a coil conductor on the electrical insulating layers. Each of the capacitor electrodes includes ground-side extended portions extending to the pair of side surfaces and the coil conductor includes coil extended portions extending to the pair of side surfaces. Each of the side surfaces is provided with a ground-side terminal electrode connected to each of the ground-side extended portions and a plurality of hot-side terminal electrodes connected to the coil extended portions are arranged so as to be connected to the end of the inductor element, the plurality of hot-side terminal electrodes being placed on the side surfaces so as to sandwich the ground-side terminal electrodes, and the hot-side terminal electrodes are not disposed on the pair of end surfaces.

Preferably, the coil extended portions include a connecting path for connecting the pair of side surfaces and the connecting path is connected to the remainder of the coil conductor at the middle point of the connecting path in the longitudinal direction.

The ground-side terminal electrodes and the hot-side terminal electrodes may be formed by applying and baking a conductive paste.

Each of the ground-side terminal electrodes and each of the hot-side terminal electrodes may extend in a band-shape on the pair of side surfaces and between the edge line of the upper surface and the edge line of the lower surface and may have extended portions extending to a portion of the upper surface and the lower surface.

In the first preferred embodiment of the present invention, each of the coil extended portions may be arranged so as to reach the side surface and the end surface in the vicinity of the edge where the side surface intersects the end surface.

In order to connect the capacitor element and the inductor element, each of the capacitor electrodes may further include hot-side extended portions to be connected to the hot-side terminal electrodes. Also, the inside of the main body may be provided with a via-hole conductor for connecting the capacitor element and the inductor element.

When each of the capacitor electrodes includes hot-side extended portions to be connected to the hot-side terminal electrodes and when each of the hot-side terminal electrodes includes the end-surface extended portion extending to a portion of the end surface, each of the hot-side extended portions is preferably arranged so as to reach the side surface and the end surface in the vicinity of the edge where the side surface intersects the end surface.

Another preferred embodiment of the present invention provides a method for manufacturing the above-described multilayered LC composite component.

The method for manufacturing the multilayered LC composite component according to another preferred embodiment of the present invention includes the steps of preparing the main body, and simultaneously forming the ground-side terminal electrode and the hot-side terminal electrode on at least one of side surfaces of the main body.

Also, when the manufacturing method according to preferred embodiments of the present invention is applied for manufacturing the multilayered LC composite component in which the coil extended portions and/or hot-side extended portions are formed so as to reach the side surfaces and the end surfaces in the vicinity of the edges where the side surfaces intersect the end surfaces, the manufacturing method preferably includes the steps of preparing the main body, polishing the main body so as to shave off at least edges of the main body, and simultaneously forming the ground-side terminal electrode and the hot-side terminal electrode on at least one of side surfaces of the main body.

Other features, elements, characteristics and advantages of the present invention will become more apparent from the following detailed description of preferred embodiments thereof with reference to the attached drawings.

DETAILED DESCRIPTION OF PREFERRED EMBODIMENTS

Figure 1:
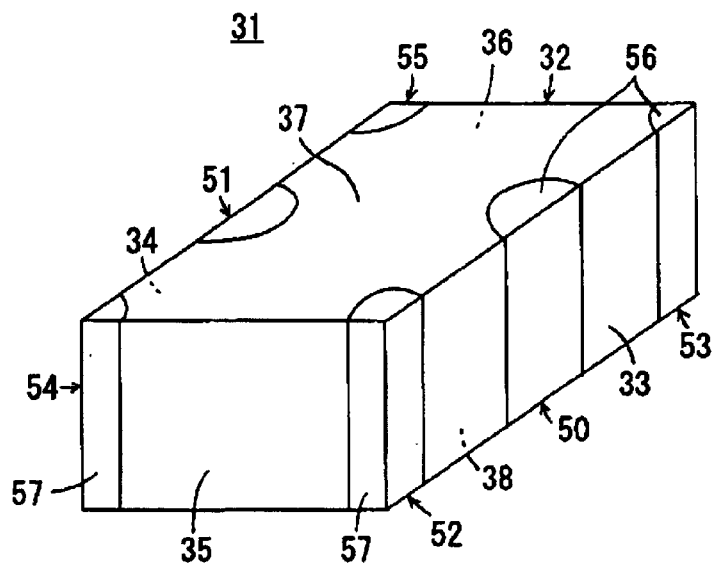
FIG. 1 is a perspective view showing a multilayered LC composite component 31 according to a first preferred embodiment of the present invention.
Figure 2:
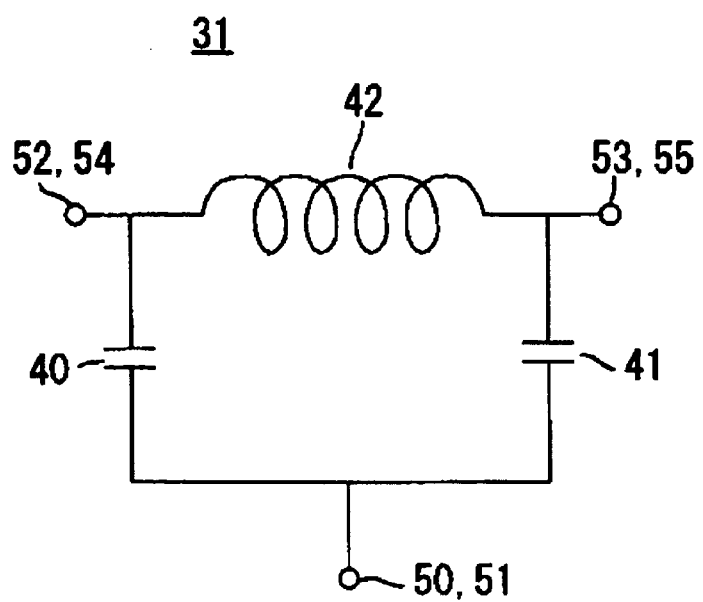
FIG. 2 is an equivalent circuit diagram of the multilayered LC composite component 31 shown in FIG. 1.
Figure 3:
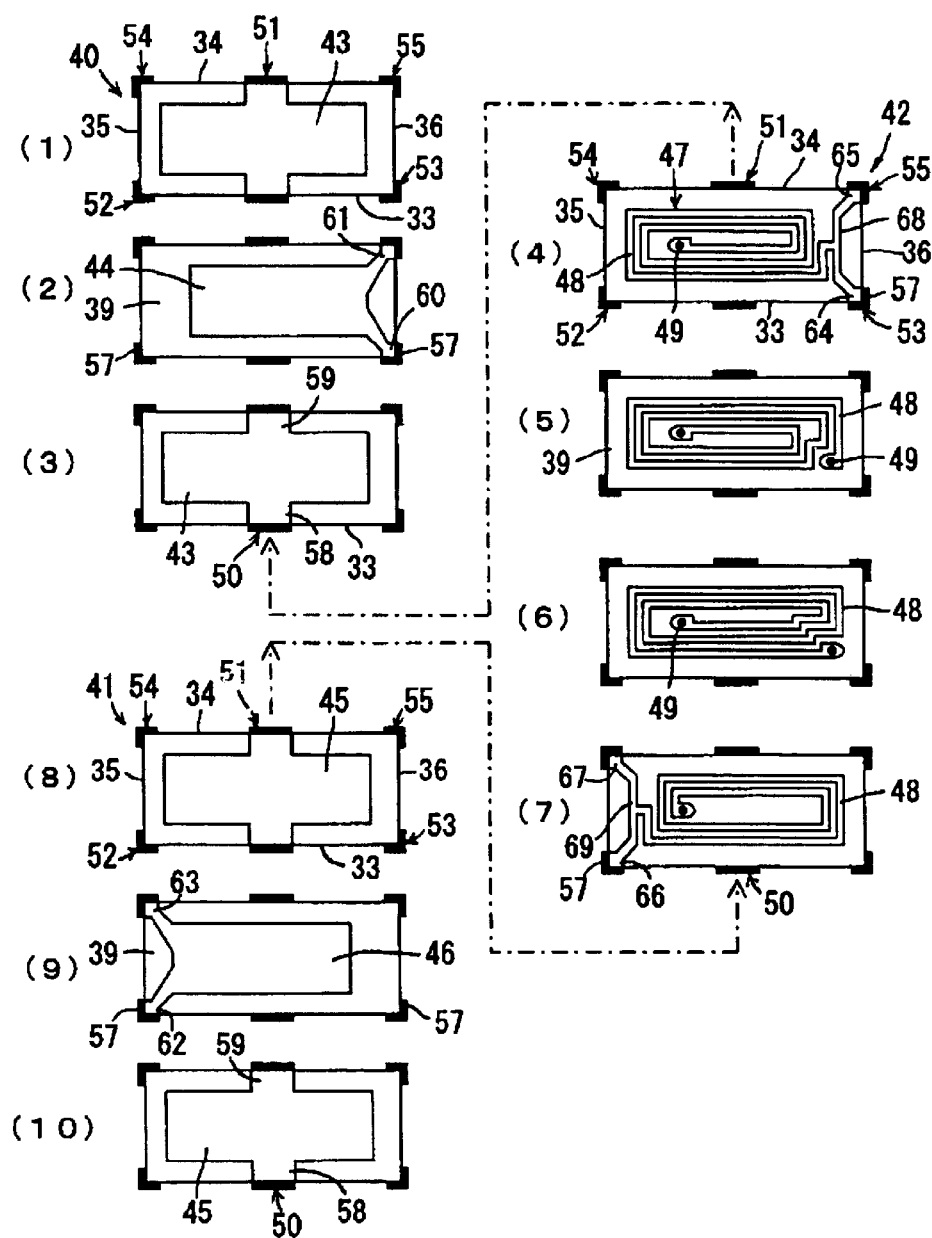
FIG. 3 includes plan views showing the exploded multilayered LC composite component 31 shown in FIG. 1.

FIG. 1 is a perspective view showing a multilayered LC composite component 31 according to a first preferred embodiment of the present invention. FIG. 2 is an equivalent circuit diagram of the multilayered LC composite component 31 shown in FIG. 1. FIG. 3 includes plan views showing the multilayered LC composite component 31 exploded in the laminated direction.

The multilayered LC composite component 31 includes a substantially rectangular main body 32. The main body 32 includes a pair of side surfaces 33 and 34 facing each other, a pair of end surfaces 35 and 36 facing each other, and an upper surface 37 and a lower surface 38 facing each other.

The main body 32 is, for example, about 1.6 mm in length, about 0.8 mm in width, and about 0.6 mm in height.

As shown in FIG. 3, the main body 32 has a multilayer construction including a plurality of electrical insulating layers 39. The main body 32 includes a capacitor element 40 shown by (1) to (3) in FIG. 3, a capacitor element 41 shown by (8) to (10) in FIG. 3, and an inductor element 42 shown by (4) to (7) in FIG. 3. In this preferred embodiment, one inductor element (L) 42 is disposed between the two capacitor elements (C) 40 and 41 so as to define a C-L-C arrangement.

Each of the electrical insulating layers 39 preferably comprises ceramic. In this case, the material characteristics of the ceramics defining the electrical insulating layers 39 may be different if necessary. That is, the electrical insulating layers 39 in the capacitor elements 40 and 41 may include a dielectric ceramic and the electrical insulating layers 39 in the inductor element 42 may include a magnetic ceramic. Each of the electrical insulating layers 39 has a thickness of, for example, about 12 µm.

In order to configure the main body 32, several electrical insulating layers, on which a conductor is not provided, are laminated on the upper and lower sides of the main body 32, as well as the plurality of electrical insulating layers 39 shown in FIG. 3, if necessary.

In the capacitor element 40, capacitor electrodes 43 and 44 are disposed on the electrical insulating layers 39. The capacitor electrodes 43 are ground-side capacitor electrodes and the capacitor electrode 44 is a hot-side capacitor electrode. These electrodes are stacked one after the other and face each other, with the electrical insulating layer 39 therebetween, so as to define a capacitance.

Likewise, ground-side capacitor electrodes 45 and a hot-side capacitor electrode 46 are disposed in the capacitor element 41.

The alignment order of the ground-side capacitor electrode 43 and the hot-side capacitor electrode 44 in the capacitor element 40 may be opposite to that shown in FIG. 3. That is, the alignment order in FIG. 3 is one ground-side capacitor electrode 43, the hot-side capacitor electrode 44, and the other ground-side capacitor electrode 43. However, the alignment order may be a hot-side capacitor electrode 44, a ground-side capacitor electrode 43, and a hot-side capacitor electrode 44.

The number of repetitions of the structure including the ground-side capacitor electrode 43 and the hot-side capacitor electrode 44 in the capacitor element 40 may be arbitrarily increased and decreased as required.

The foregoing can be applied to the ground-side capacitor electrodes 45 and the hot-side capacitor electrode 46 in the capacitor element 41.

A coil conductor 47 is provided on the electrical insulating layers 39 in the inductor element 42. The coil conductor 47 includes a plurality of coil conductive films 48 spirally extending over specific interfaces between the plurality of electrical insulating layers 39 and coil via-hole conductors 49 penetrating the specific electrical insulating layers 39. End portions of the coil conductive films 48 are connected by the coil via-hole conductors 49 so that the overall coil conductor 47 defines a helix.

Each of the coil conductive films 48 is, for example, about 50 µm wide and about 7 µm thick.

The coil conductive films 48 shown in FIG. 3 have a spiral pattern on the specific electrical insulating layers 39. However, the coil conductive films 48 need not have a spiral pattern.

The capacitor electrodes 43 to 46 and the coil conductor 47 are preferably formed by applying a conductive paste including a conductive component, for example, Cu, Ag, or Ag—Pd, and by baking the conductive paste in a baking process in order to obtain the main body 32.

Further, the conductive paste is applied by printing in order to form the capacitor electrodes 43 to 46 and the coil conductive films 48 with a desired pattern. Also, in order to provide the coil via-hole conductors 49, via-holes are formed by laser processing a green sheet which is to be a specific electrical insulating layer 39 and by filling the conductive paste in the via-holes.

Ground-side terminal electrodes 50 and 51 are disposed at the approximate center of the pair of side surfaces 33 and 34 of the main body 32, respectively.

Also, hot-side terminal electrodes 52 to 55 are disposed at the edges of between the end surfaces 35 and 36 and the pair of side surfaces 33 and 34.

Preferably, these terminal electrodes 50 to 55 are formed by applying a conductive paste on the outer surface of the main body 32 and by baking the paste.

In order to apply the conductive paste, the following methods can be adopted: the main body 32 is placed on a slit plate having slits for passing a conductive paste therethrough and the conductive paste is applied on the main body 32 by discharging the conductive paste through the slits; or the main body 32 is placed on an elastic grooved plate having grooves filled with a conductive paste, the main body 32 is pressed against the grooved plate so that the grooved plate is compressed to deform in the thickness direction, thereby applying the conductive paste in the grooves onto the main body 32.

With the above-described methods, the conductive paste for the terminal electrodes 50, 52, and 53 can be applied simultaneously by applying the conductive paste on the side surface 33. Also, the conductive paste for the terminal electrodes 51, 54, and 55 can be applied simultaneously by applying the conductive paste on the side surface 34. Accordingly, the number of processes for applying the conductive paste can be reduced to two, and thus, the cost for manufacturing the multilayered LC composite component 31 is greatly reduced.

By applying the conductive paste in the above-described method, the ground-side terminal electrodes 50 and 51 extend in a band-shape over the side surfaces 33 and 34 and the hot-side terminal electrodes 52 to 55 extend in a band-shape along edges between the upper surface 37 and the lower surface 38.

Further, the ground-side terminal electrodes 50 and 51 and the hot-side terminal electrodes 52 to 55 include extended portions 56, which are formed by the applied conductive paste, extending to portions of the upper surface 37 and the lower surface 38.

The hot-side terminal electrodes 52 to 55 have end-surface extended portions 57 extending to portions of the end surfaces 35 and 36.

Among the capacitor electrodes 43 to 46, each of the ground-side capacitor electrodes 43 and 45 includes ground-side extended portions 58 and 59 which extend to the pair of side surfaces 33 and 34, respectively. The ground-side extended portions 58 and 59 are connected to the ground-side terminal electrodes 50 and 51, respectively.

Also, the hot-side capacitor electrode 44 includes hot-side extended portions 60 and 61 which extend to the end of the side surfaces 33 and 34, respectively.

In this preferred embodiment, the hot-side extended portions 60 and 61 are substantially symmetrical to each other and extend to the side surfaces 33 and 34 and the end surface 36 in the vicinity of the edges where the side surfaces 33 and 34 intersect the end surface 36.

The hot-side extended portions 60 and 61 are connected to the hot-side terminal electrodes 53 and 55, respectively.

Likewise, the hot-side capacitor electrode 46 includes hot-side extended portions 62 and 63. The hot-side extended portions 62 and 63 extend to the side surfaces 33 and 34 and the end surface 35 in the vicinity of the edges where the side surfaces 33 and 34 intersect the end surface 35, and are connected to the hot-side terminal electrodes 52 and 54, respectively.

The coil conductor 47 includes coil extended portions 64 to 67 extending to the side surfaces 33 and 34. The coil extended portions 64 and 65 are provided as extended portions of the coil conductive film 48 disposed at one end of the inductor element 42. The coil extended portions 66 and 67 are provided as extended portions of the conductive film 48 placed at the other end of the inductor element 42.

In this preferred embodiment, the coil extended portions 64 and 65 extend to the side surfaces 33 and 34 and the end surface 36 in the vicinity of the edges where the side surfaces 33 and 34 intersect the end surface 36.

The coil extended portions 64 and 65 are connected to the hot-side terminal electrodes 53 and 55, respectively.

The coil extended portions 64 and 65 are connected to a connecting path 68 for connecting the side surfaces 33 and 34. The connecting path 68 is connected to the remainder of the coil conductor 47 at its middle point in the longitudinal direction. That is, the distance from the connection point of the connecting path 68 and the remainder of the coil conductor 47 to the end of the coil extended portion 64 is substantially equal to the distance from the connection point to the end of the coil extended portion 65.

The coil extended portions 66 and 67 are formed in substantially the same way as the coil extended portions 64 and 65. The coil extended portions 66 and 67 extend to the side surfaces 33 and 34 and the end surface 35 in the vicinity of the edges where the side surfaces 33 and 34 intersect the end surface 35, and are connected to the hot-side terminal electrodes 52 and 54, respectively.

Further, the coil extended portions 66 and 67 are connected to a connecting path 69 for connecting the side surfaces 33 and 34. The connecting path 69 is connected to the remainder of the coil conductor 47 at its middle point in the longitudinal direction.

As in this preferred embodiment, when the extended portions 58 to 67 extend to the side surfaces 33 and 34 and the end surfaces 35 and 36 in the vicinity of the edges where the side surfaces 33 and 34 intersect the end surfaces 35 and 36, the extended portions 58 to 67 can be reliably exposed at the edges by polishing the main body 32 by barrel polishing or other suitable process so as to shave off at least the edges of the main body 32 before the above-described process for forming the terminal electrodes 50 to 55. Therefore, the hot-side terminal electrodes 52 to 55 can be preferably connected to the extended portions 58 to 67, and thus the DC resistance and open defect can be reduced.

The multilayered LC composite component 31 according to the above-described preferred embodiment can be represented by the equivalent circuit shown in FIG. 2. That is, the multilayered LC composite component 31 constitutes a π-type LC filter. In FIG. 2, elements corresponding to those shown in FIG. 1 or 3 are denoted by the same reference numerals.

As shown in FIG. 2, the inductor element 42 is connected to the ground-side terminal electrodes 50 and 51 via the capacitor elements 40 and 41. Also, the hot-side terminal electrodes 52 and 54 and the hot-side terminal electrodes 53 and 55 are connected to corresponding end portions of the inductor element 42.

In this preferred embodiment, the end-surface extended portions 57 of the hot-side terminal electrodes 52 to 55 are arranged so as to expose substantially the center of each of the end surfaces 35 and 36. Accordingly, the end-surface extended portions 57 do not face each of the capacitor electrodes 43 to 46 and the coil conductor 47 in the longitudinal direction of the main body 32 (the direction that is substantially parallel to the direction in which the side surfaces 33 and 34 and the upper surface 37 and the lower surface 38 extend). Therefore, stray capacitance, which is generated between each of the end-surface extended portions 57 and each of the capacitor electrodes 43 to 46 and the coil conductor 47, is minimized.

In FIG. 3, the laminating order of the electrical insulating layers 39 is indicated by the dashed-line arrows. That is, the electrical insulating layers 39 are laminated in the following order: (10), (9), . . . , (2), and (1) from the bottom. Accordingly, the multilayered LC composite component 31 has the C-L-C arrangement in this laminating direction. However, the arrangement may be changed to L-C-L.

Figure 4A:
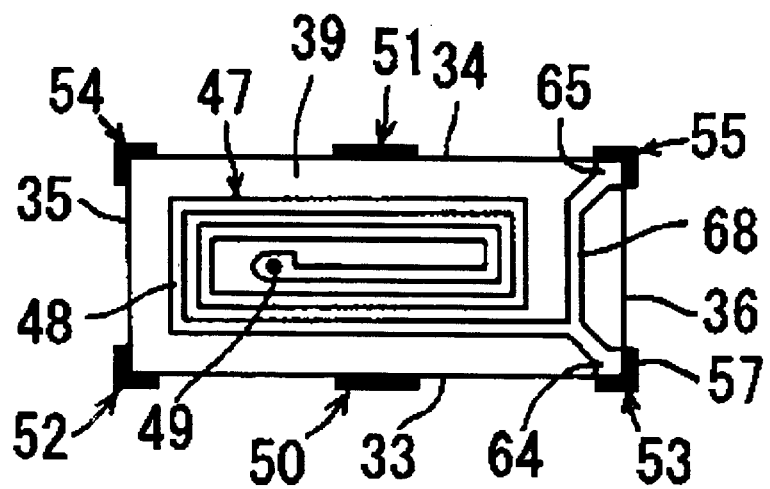
FIGS. 4A and 4B are for illustrating a second preferred embodiment and FIG. 4A corresponds to (4) in FIG. 3 and FIG. 4B corresponds to (7) in FIG. 3.
Figure 4B:
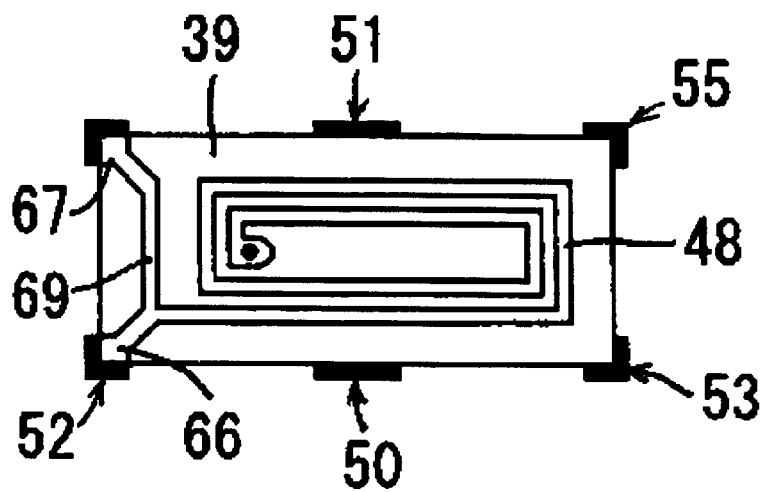

FIGS. 4A and 4B are for illustrating a second preferred embodiment of the present invention. FIG. 4A corresponds to (4) in FIG. 3 and FIG. 4B corresponds to (7) in FIG. 3. In FIGS. 4A and 4B, elements corresponding to the elements shown in FIG. 3 are denoted by the same reference numerals and duplicate descriptions will be omitted. In the second preferred embodiment, elements except for the elements shown in FIGS. 4A and 4B are substantially the same as those in the first preferred embodiment.

In the first preferred embodiment, the coil extended portions 64 and 65 and the coil extended portions 66 and 67 are connected to the connecting paths 68 and 69 for connecting the side surfaces 33 and 34, and each of the connecting paths 68 and 69 is connected to the remainder of the coil conductor 47 at the middle point in the longitudinal direction. Accordingly, the inductance generated by the inductor element 42 is substantially the same in both cases where only the hot-side terminal electrodes 52 and 53 on the side surface 33 are used and where only the hot-side terminal electrodes 54 and 55 on the side surface 34 are used, and thus, directionality of the inductor element 42 can be eliminated. Generally, only the hot-side terminal electrodes 52 and 53 or only the hot-side terminal electrodes 54 and 55 are used in order to select the characteristics of the multilayered LC composite component 31. However, as described above, if substantially the same inductance can be obtained by using any of the terminal electrodes, the difference in the inductance caused by the difference in terminal electrodes to be used for selecting the characteristics can be eliminated, and thus, a reliable and secure selection can be performed.

However, when the above-described advantages are not desired, the configuration shown in FIGS. 4A and 4B can be adopted.

That is, in the second preferred embodiment shown in FIGS. 4A and 4B, the connecting path 68 connected to the coil extended portions 64 and 65 and the connecting path 69 connected to the coil extended portions 66 and 67 are connected to the remainder of the coil conductor 47 at positions other than the middle point in the longitudinal direction.

In the first and second preferred embodiments, the coil extended portions 64 to 67 and the hot-side extended portions 60 to 63 are arranged so as to extend to the side surfaces 33 and 34 of the main body 32 and the end surfaces 35 and 36.

However, the present invention is not limited to this configuration. For example, the coil extended portions 64 to 67 may not reach the end surfaces 35 and 36. Also, the hot-side extended portions 60 to 63 may not reach the end surfaces 35 and 36. Even in that case, the hot-side terminal electrodes 52 to 55 are arranged in the manner shown in FIGS. 4A and 4B.

Further, even when the coil extended portions 64 to 67 and the hot-side extended portions 60 to 63 are arranged so as to reach the side surfaces 33 and 34 of the main body 32 and the end surfaces 35 and 36, the length of the exposed portions of the coil extended portions 64 to 67 and the hot-side extended portions 60 to 63 at the side surfaces 33 and 34 may be different from the length of the exposed portions at the end surfaces 35 and 36.

Figure 5:
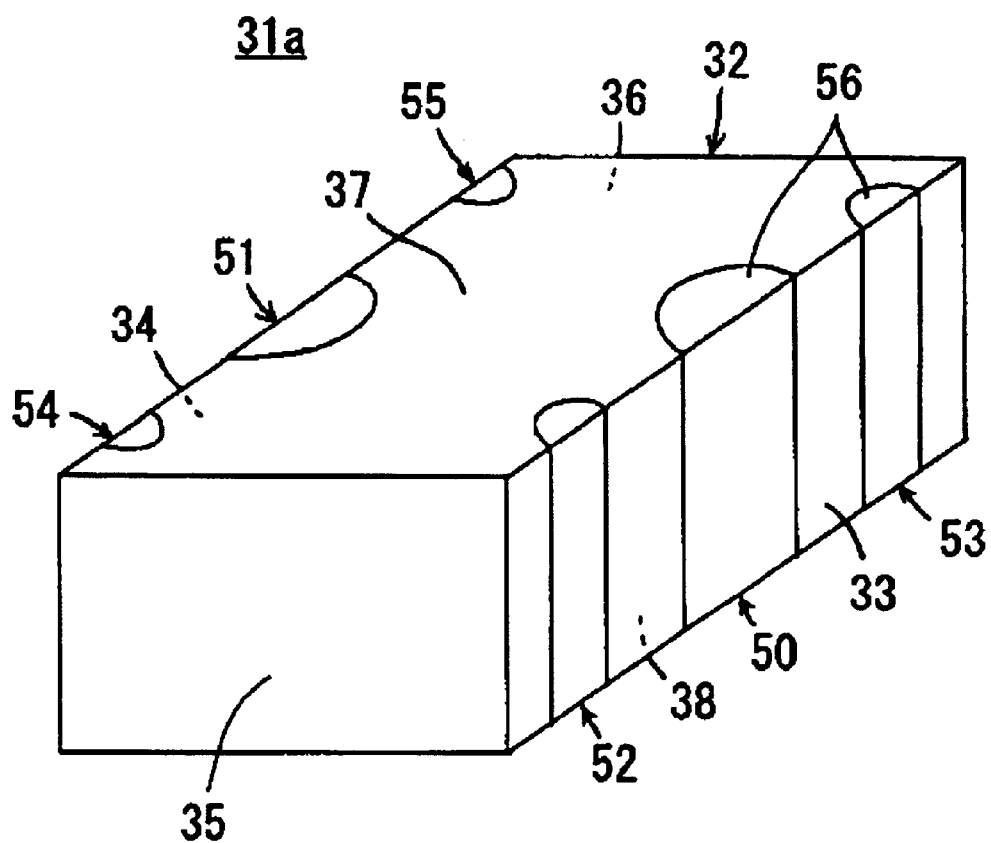
FIG. 5 is a perspective view showing a multilayered LC composite component 31a according to a third preferred embodiment of the present invention.
Figure 6A:
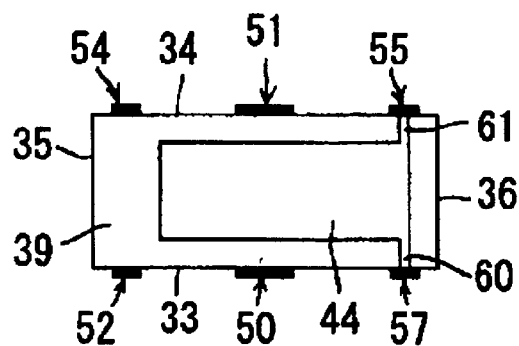
FIGS. 6A to 6D are plan views showing the exploded multilayered LC composite component shown in FIG. 5, and FIG. 6A corresponds to (2) in FIG. 3, FIG. 6B corresponds to (4) in FIG. 3, FIG. 6C corresponds to (7) in FIG. 3, and FIG. 6D corresponds to (9) in FIG. 3.
Figure 6B:
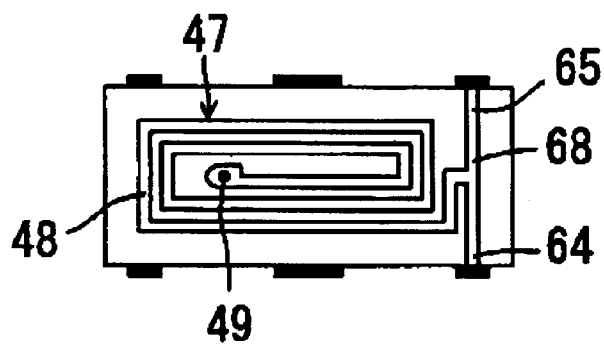
Figure 6C:
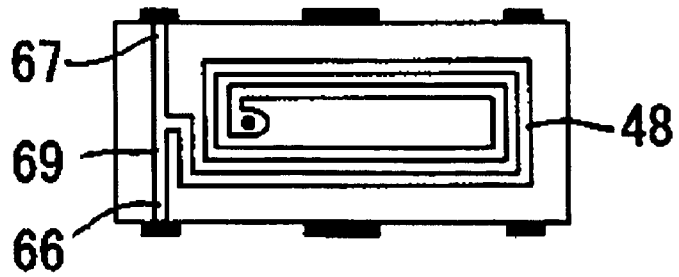
Figure 6D:
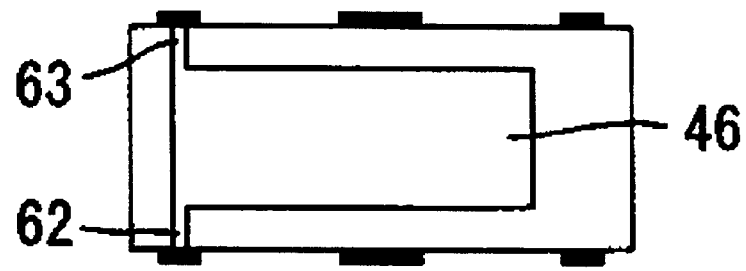

FIGS. 5 and 6A to 6D illustrate a third preferred embodiment of the present invention. FIG. 5 corresponds to FIG. 1 and is a perspective view showing a multilayered LC composite component 31a according to the third preferred embodiment. FIG. 6A corresponds to (2) in FIG. 3, FIG. 6B corresponds to (4) in FIG. 3, FIG. 6C corresponds to (7) in FIG. 3, and FIG. 6D corresponds to (9) in FIG. 3. In FIGS. 5 and 6A to 6D, elements corresponding to the elements shown in FIGS. 1 and 3 are denoted by the same reference numerals, and duplicate descriptions will be omitted.

As shown in FIG. 5, in the multilayered LC composite component 31a according to the third preferred embodiment, each of the hot-side terminal electrodes 52 to 55 does not have an end-surface extended portion which extends to a portion of the end surfaces 35 and 36 of the main body 32.

Thus, as shown in FIG. 6, the hot-side extended portions 60 to 63 and the coil extended portions 64 to 67 are arranged so as to reach only the side surfaces 33 or 34.

In this preferred embodiment, too, the main body 32 is, for example, about 1.6 mm in length, about 0.8 mm in width, and about 0.6 mm in height.

Figure 7:
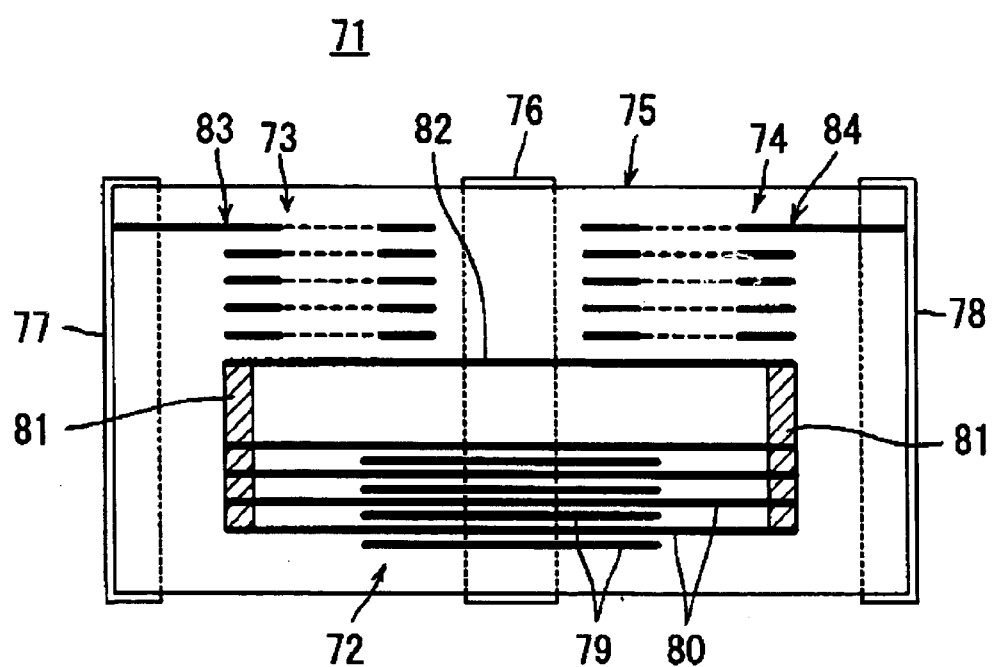
FIG. 7 is a sectional view showing the inner configuration of a multilayered LC composite component 71 according to a fourth preferred embodiment of the present invention.
Figure 8:
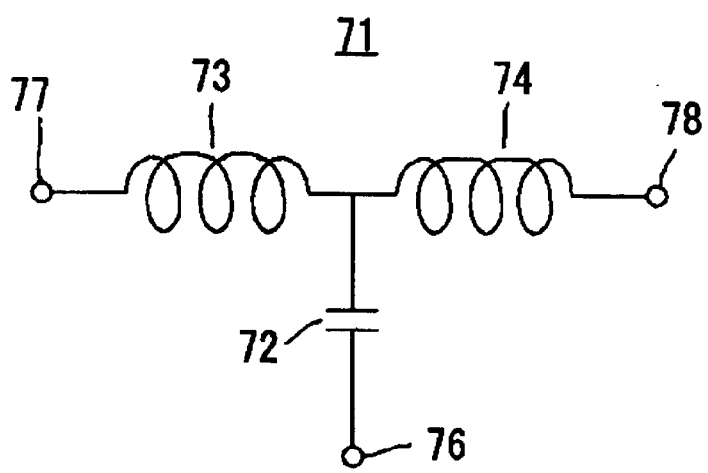
FIG. 8 is an equivalent circuit diagram of the multilayered LC composite component 71 shown in FIG. 7.

FIGS. 7 and 8 illustrate a fourth preferred embodiment of the present invention. FIG. 7 is a sectional view for schematically showing the inner configuration of a multilayered LC composite component 71 according to the fourth preferred embodiment. FIG. 8 is an equivalent circuit diagram of the multilayered LC composite component 71 shown in FIG. 7.

The multilayered LC composite component 71 according to the fourth preferred embodiment includes a main body 75 having one capacitor element 72 and two inductor element 73 and 74.

On the outer surface of the main body 75, terminal electrodes are formed in substantially the same manner as with the terminal electrodes 50 to 55 of the first preferred embodiment described with reference to FIGS. 1 to 3. Among these terminal electrodes, only a ground-side terminal electrode 76 and hot-side terminal electrodes 77 and 78 are shown.

Ground-side capacitor electrodes 79 disposed in the capacitor element 72 are connected to the ground-side terminal electrode 76. Hot-side capacitor electrodes 80 disposed in the capacitor element 72 are connected to a connecting conductive film 82 via connecting via-hole conductors 81.

One end of each of coil conductors 83 and 84 disposed in the inductor elements 73 and 74, respectively, is connected to the connecting conductive film 82, and the other end of each of the coil conductors 83 and 84 is connected to the hot-side terminal electrodes 77 and 78, respectively.

Each of the coil conductors 83 and 84 extends in a helical manner, but coil via-hole conductors are not shown.

The multilayered LC composite component 71 can be represented by an equivalent circuit diagram in FIG. 8 and constitutes a T-type LC filter. In FIG. 8, elements corresponding to the elements shown in FIG. 7 are denoted by the same reference numerals.

Figure 9:
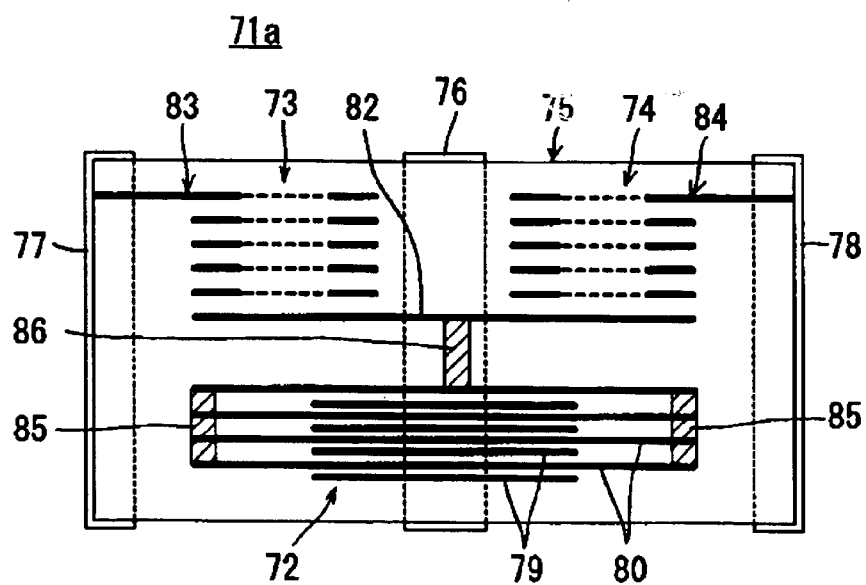
FIG. 9 is a sectional view showing the inner configuration of a multilayered LC composite component 71a according to a fifth preferred embodiment of the present invention.

FIG. 9 is for illustrating a fifth preferred embodiment of the present invention and is a sectional view corresponding to FIG. 7. In FIG. 9, elements corresponding to the elements shown in FIG. 7 are denoted by the same reference numerals and duplicate descriptions will be omitted.

A multilayered LC composite component 71a shown in FIG. 9 can also be represented by the equivalent circuit in FIG. 8, constituting the T-type LC filter.

In the multilayered LC composite component 71a, the plurality of hot-side capacitor electrodes 80 in the capacitor element 72 are mutually connected by connecting via-hole conductors 85. Also, the endmost hot-side capacitor electrodes 79 are connected to the connecting conductive film 82 via a connecting via-hole conductor 86.

Figure 10:
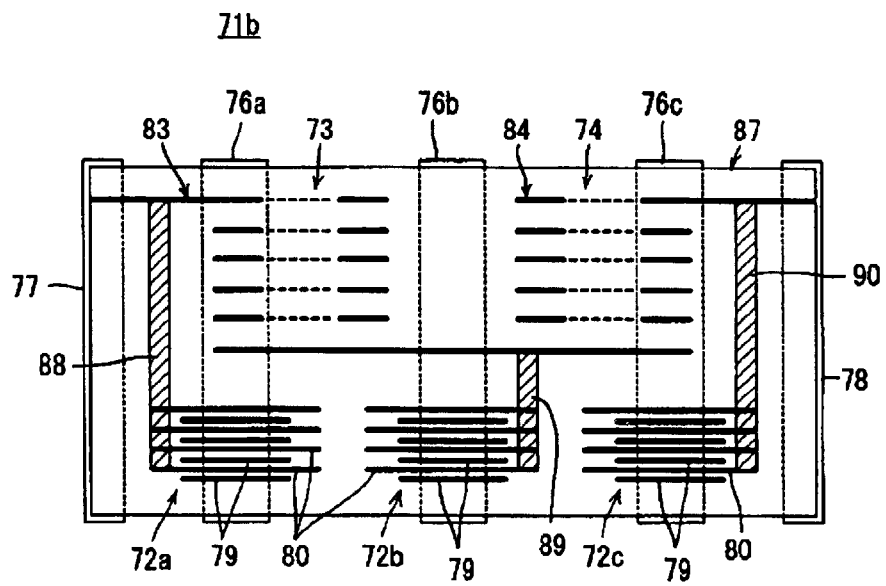
FIG. 10 is a sectional view showing the inner configuration of a multilayered LC composite component 71b according to a sixth preferred embodiment of the present invention.
Figure 11:
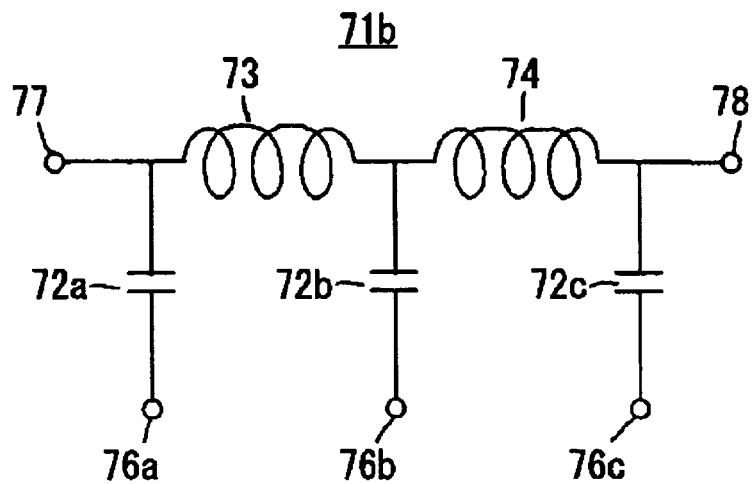
FIG. 11 is an equivalent circuit diagram of the multilayered LC composite component 71b shown in FIG. 10.

FIGS. 10 and 11 are for illustrating a sixth preferred embodiment of the present invention. FIG. 10 is a sectional view showing the inner configuration of a multilayered LC composite component 71b according to the sixth preferred embodiment and FIG. 11 is an equivalent circuit diagram of the multilayered LC composite component 71b shown in FIG. 10. In FIGS. 10 and 11, elements corresponding to the elements shown in FIGS. 7 and 8 are denoted by the same reference numerals, and duplicate descriptions will be omitted.

The multilayered LC composite component 71b according to the sixth preferred embodiment includes a main body 87 having three capacitor elements 72a, 72b, and 72c, and two inductor elements 73 and 74.

Further, three ground-side terminal electrodes 76a, 76b, and 76c are disposed on the main body 87. Ground-side capacitor electrodes 79 in the capacitor element 72a are connected to the ground-side terminal electrode 76a, ground-side capacitor electrodes 79 in the capacitor element 72b are connected to the ground-side terminal electrode 76b, and ground-side capacitor electrodes 79 in the capacitor element 72c are connected to the ground-side terminal electrode 76c.

Although the ground-side terminal electrodes 76a, 76b, and 76c are separated in FIG. 10, they may be integrated.

Hot-side capacitor electrodes 80 in the capacitor element 72a are connected to one end of a coil conductor 83 in the inductor element 73 via a connecting via-hole conductor 88. Hot-side capacitor electrodes 80 in the capacitor element 72b are connected to a connecting conductive film 82 via a connecting via-hole conductor 89. Hot-side capacitor electrodes 80 in the capacitor element 72c are connected to one end of a coil conductor 84 in the inductor element 74 via a connecting via-hole conductor 90.

In this way, the multilayered LC composite component 71b can be represented by the equivalent circuit for constituting a double-π-type LC filter shown in FIG. 11. In FIG. 11, elements corresponding to the elements shown in FIG. 10 are denoted by the same reference numerals.

Figure 12:
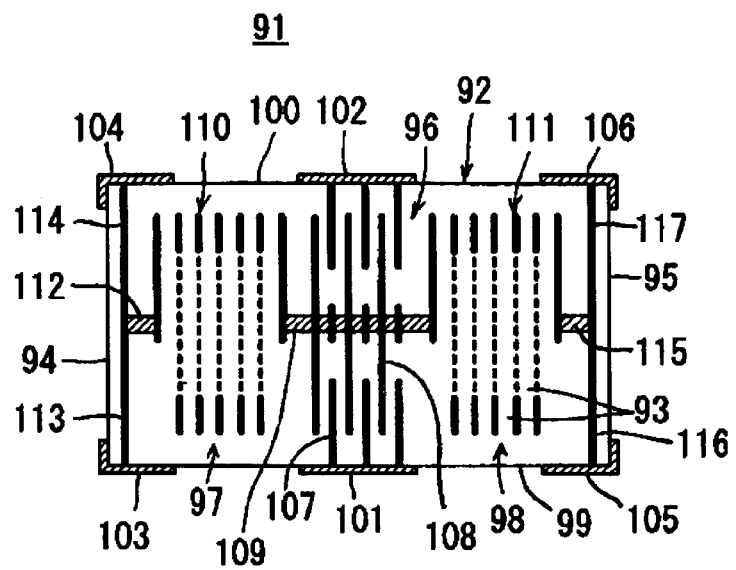
FIG. 12 is a sectional view showing the inner configuration of a multilayered LC composite component 91 according to a seventh preferred embodiment of the present invention.
Figure 13:
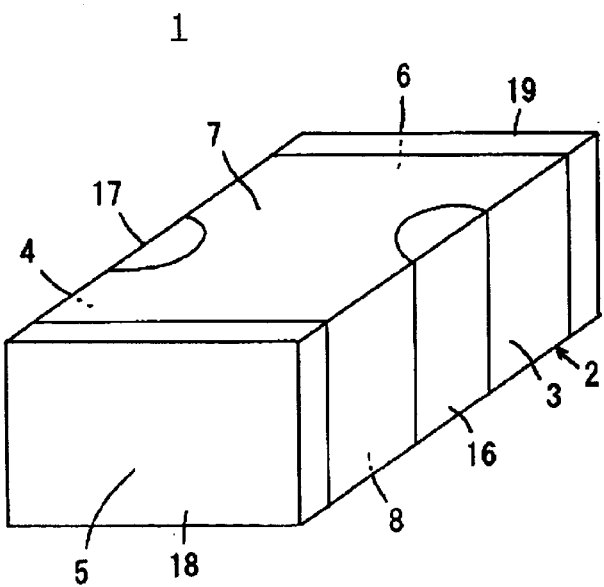
FIG. 13 is a perspective view showing a known multilayered LC composite component 1.
Figure 14:
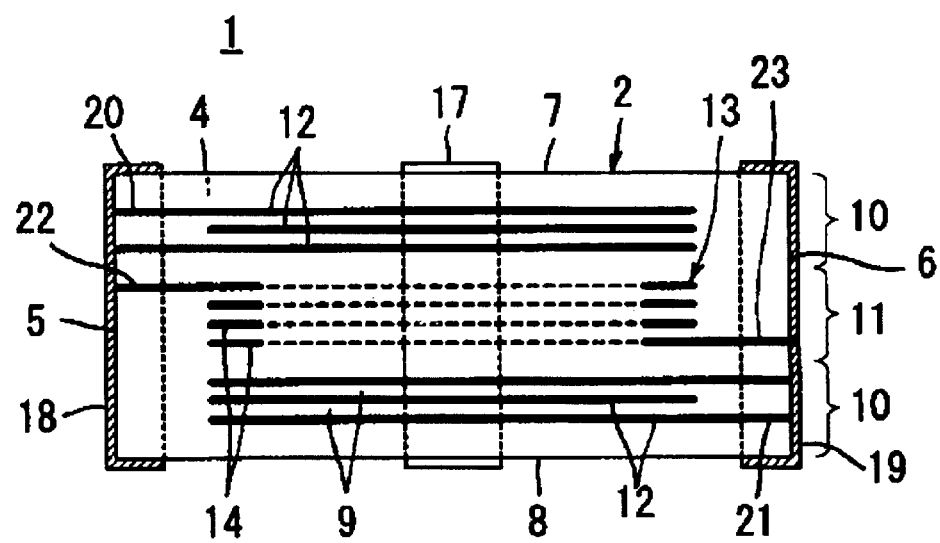
FIG. 14 is a sectional view showing the inner configuration of the multilayered LC composite component 1 shown in FIG. 13.

FIG. 12 is for illustrating a seventh preferred embodiment of the present invention and is a sectional view showing the inner configuration of a multilayered LC composite component 91.

In the multilayered LC composite component 91 according to the seventh preferred embodiment, the laminating direction of electrical insulating layers 93 in a main body 92 is different from that in the first to sixth preferred embodiments. That is, in the multilayered LC composite component 91, the electrical insulating layers 93 are laminated from one end surface 94 toward the other end surface 95 of the main body 92.

The main body 92 includes one capacitor element 96 and two inductor elements 97 and 98 sandwiching the capacitor element 96.

On each of the side surfaces 99 and 100 of the main body 92, ground-side terminal electrodes 101 and 102 and hot-side terminal electrodes 103, 104, 105, and 106 are formed in substantially the same manner as in the first preferred embodiment described with reference to FIGS. 1 to 3.

Ground-side capacitor electrodes 107 in the capacitor element 96 are connected to the ground-side terminal electrodes 101 and 102.

Hot-side capacitor electrodes 108 in the capacitor element 96 are mutually connected by a connecting via-hole conductor 109 and are connected to one end of each of coil conductors 110 and 111 in the inductor elements 97 and 98, respectively.

The other end of the coil conductor 110 in the inductor element 97 defines a connecting via-hole conductor 112 and coil extended portions 113 and 114 connected thereto. The coil extended portion 113 is connected to the hot-side terminal electrode 103 and the coil extended portion 114 is connected to the hot-side terminal electrode 104.

Likewise, the other end of the coil conductor 111 in the inductor element 98 defines a connecting via-hole conductor 115 and coil extended portions 116 and 117 connected thereto. The coil extended portion 116 is connected to the hot-side terminal electrode 105 and the coil extended portion 117 is connected to the hot-side terminal electrode 106.

As described above, the multilayered LC composite component 91 shown in FIG. 12 has an L-C-L arrangement and constitutes a T-type LC filter as the equivalent circuit of the multilayered LC composite component 71 shown in FIG. 8.

The multilayered LC composite components according to the fourth to seventh preferred embodiments shown in FIGS. 7 to 12 have the characteristics of the multilayered LC composite component according to the first preferred embodiment shown in FIGS. 1 to 3, as long as no specific description is given.

The present invention has been described based on preferred embodiments with reference to the drawings. However, various modifications can be achieved within the scope of the present invention.

In the preferred embodiments, as shown in FIG. 1 for example, the ground-side terminal electrodes 50 and 51 and the hot-side terminal electrodes 52 to 55 are disposed on the pair of side surfaces 33 and 34 of the main body 32 without directionality. However, these terminal electrodes may be disposed on only one of the side surfaces.

In each of the foregoing preferred embodiments, the multilayered LC composite component constitutes an LC filter. However, the multilayered LC composite component may be an array-type or may be one including an electrical element other than LC.

As described above, according to preferred embodiments of the present invention, the ground-side terminal electrodes are disposed on the pair of side surfaces and the hot-side terminal electrodes are disposed along the edges. The ground-side terminal electrodes and the hot-side terminal electrodes on the same surface can be formed simultaneously. When these terminal electrodes are formed by applying a conductive paste, the number of processes for applying the conductive paste can be reduced, and as a result, the cost for manufacturing the multilayered LC composite component can be reduced.

When each of the hot-side terminal electrodes includes an extended portion, the extended portion is arranged so that at least substantially the center of the end surfaces of the main body is exposed. Thus, stray capacitance generated between the hot-side terminal electrodes and each of the hot-side capacitor electrodes, the coil conductor, and the ground-side terminal electrodes is greatly reduced. Accordingly, reduction in the self-resonance frequency of the multilayered LC composite component can be prevented, an excellent noise-removing characteristic can be maintained in a high-frequency region, and thus an excellent high-frequency characteristic can be obtained.

Further, since the ground-side terminal electrodes and the hot-side terminal electrodes are disposed on the pair of side surfaces of the main body, directionality of the multilayered LC composite component is eliminated.

In the above case, the coil extended portions are connected to the connecting path for connecting the pair of side surfaces and the connecting path is connected to the remainder of the coil conductor at the middle point in the longitudinal direction. Accordingly, the difference in the inductance generated by the coil conductor when the terminal electrodes on one side surface are used and when the terminal electrodes on the other side surface are used can be eliminated and thus, directionality in the inductor element can be substantially eliminated. Therefore, excellent characteristics of the multilayered LC composite component can be achieved reliably even when only the terminal electrodes on one side surface are used.

In preferred embodiments of the present invention, when each of the hot-side terminal electrodes includes an end-surface extended portion extending to a portion of the end surface and when the coil extended portions and/or the hot-side extended portions extend to the side surfaces and the end surfaces in the vicinity of edges where the side surfaces intersect the end surfaces, the extended portions can be reliably exposed by polishing the main body so as to shave off at least the edges of the main body. Accordingly, the extended portions can be preferably connected to the hot-side terminal electrodes, and thus the DC resistance and open defect are minimized.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A multilayered LC composite component comprising:
    a main body having a pair of side surfaces facing each other, a pair of end surfaces facing each other, and an upper surface and a lower surface facing each other, wherein the main body has a laminated construction including a plurality of electrical insulating layers and has a capacitor element and an inductor element;

the capacitor element including capacitor electrodes disposed on the electrical insulating layers and the inductor element including a coil conductor disposed on the electrical insulating layers;

at least one of the capacitor electrodes includes ground-side extended portions extending to the pair of side surfaces;

the coil conductor includes coil extended portions extending to the pair of side surfaces;

each of the side surfaces is provided with a ground-side terminal electrode connected to each of the ground-side extended portions and a plurality of hot-side terminal electrodes connected to the coil extended portions are disposed on both ends of the pair of side surfaces so as to be connected to the end of the inductor element; and the pair of end surfaces are provided with end-surface extended portions of the plurality of hot-side terminal electrodes so that at least the approximate center of each of the pair of end surfaces is exposed.

2. The multilayered LC composite component according to claim 1, wherein the main body is substantially rectangular.

3. The multilayered LC composite component according to claim 1, wherein the coil extended portions include a connecting path for connecting the pair of side surfaces and the connecting path is connected to the remainder of the coil conductor at the middle point of the connecting path in the longitudinal direction.

4. The multilayered LC composite component according to claim 1, wherein each of the ground-side terminal electrodes and each of the hot-side terminal electrodes extend in a band-shape on the pair of side surfaces and between the edge line of the upper surface and the edge line of the lower surface and have extended portions extending to a portion of the upper surface and the lower surface.

5. The multilayered LC composite component according to claim 1, wherein each of the coil extended portions is arranged so as to reach the side surface and the end surface in the vicinity of the edge where the side surface intersects the end surface.

6. The multilayered LC composite component according to claim 1, wherein each of the capacitor electrodes further comprises hot-side extended portions to be connected to the hot-side terminal electrodes.

7. The multilayered LC composite component according to claim 1, wherein each of the capacitor electrodes further comprises hot-side extended portions to be connected to the hot-side terminal electrodes, and each of the hot-side extended portions is arranged so as to reach the side surface and the end surface in the vicinity of the edge where the side surface intersects the end surface.

8. The multilayered LC composite component according to claim 1, wherein the inside of the main body is provided with a via-hole conductor for connecting the capacitor element and the inductor element.

9. A method for manufacturing the multilayered LC composite component according to claim 1, comprising steps of:

preparing the main body; and simultaneously forming the ground-side terminal electrode and the hot-side terminal electrode on at least one of side surfaces of the main body.

10. A method for manufacturing the multilayered LC composite component according to claim 1, comprising steps of:

preparing the main body;

polishing the main body so as to shave off at least edges of the main body; and simultaneously forming the ground-side terminal electrode and the hot-side terminal electrode on at least one of side surfaces of the main body.

11. A multilayered LC composite component comprising:

a main body having a pair of side surfaces facing each other, a pair of end surfaces facing each other, and an upper surface and a lower surface facing each other, wherein the main body has a laminated construction including a plurality of electrical insulating layers and has a capacitor element and an inductor element;

the capacitor element including capacitor electrodes disposed on the electrical insulating layers and the inductor element including a coil conductor disposed on the electrical insulating layers;

at least one of the capacitor electrodes includes ground-side extended portions extending to the pair of side surfaces;

the coil conductor includes coil extended portions extending to the pair of side surfaces;

each of the side surfaces is provided with a ground-side terminal electrode connected to each of the ground-side extended portions and a plurality of hot-side terminal electrodes connected to the coil extended portions are arranged so as to be connected to the end of the inductor element, the plurality of hot-side terminal electrodes being arranged on the side surfaces so as to sandwich the ground-side terminal electrodes; and the hot-side terminal electrodes are not disposed on the pair of end surfaces.

12. The multilayered LC composite component according to claim 11, wherein the main body is substantially rectangular.

13. The multilayered LC composite component according to claim 11, wherein the coil extended portions include a connecting path for connecting the pair of side surfaces and the connecting path is connected to the remainder of the coil conductor at the middle point of the connecting path in the longitudinal direction.

14. The multilayered LC composite component according to claim 11, wherein each of the ground-side terminal electrodes and each of the hot-side terminal electrodes extend in a band-shape on the pair of side surfaces and between the edge line of the upper surface and the edge line of the lower surface and have extended portions extending to a portion of the upper surface and the lower surface.

15. The multilayered LC composite component according to claim 11, wherein each of the coil extended portions is arranged so as to reach the side surface and the end surface in the vicinity of the edge where the side surface intersects the end surface.

16. The multilayered LC composite component according to claim 11, wherein each of the capacitor electrodes further comprises hot-side extended portions to be connected to the hot-side terminal electrodes.

17. The multilayered LC composite component according to claim 11, wherein each of the capacitor electrodes further comprises hot-side extended portions to be connected to the hot-side terminal electrodes, and each of the hot-side extended portions is arranged so as to reach the side surface and the end surface in the vicinity of the edge where the side surface intersects the end surface.

18. The multilayered LC composite component according to claim 11, wherein the inside of the main body is provided with a via-hole conductor for connecting the capacitor element and the inductor element.

19. A method for manufacturing the multilayered LC composite component according to claim 1, comprising steps of:
 preparing the main body; and
 simultaneously forming the ground-side terminal electrode and the hot-side terminal electrode on at least one of side surfaces of the main body.

20. A method for manufacturing the multilayered LC composite component according to claim 11, comprising steps of:
 preparing the main body;
 polishing the main body so as to shave off at least edges of the main body; and
 simultaneously forming the ground-side terminal electrode and the hot-side terminal electrode on at least one of side surfaces of the main body.

* * * * *